(12) United States Patent
Nomura et al.

(10) Patent No.: US 12,237,271 B2
(45) Date of Patent: Feb. 25, 2025

(54) MODULE AND METHOD OF MANUFACTURING THE SAME

(71) Applicant: Murata Manufacturing Co., Ltd., Nagaokakyo (JP)

(72) Inventors: Tadashi Nomura, Nagaokakyo (JP); Toru Komatsu, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 592 days.

(21) Appl. No.: 17/488,888

(22) Filed: Sep. 29, 2021

(65) Prior Publication Data

US 2022/0020697 A1 Jan. 20, 2022

Related U.S. Application Data

(63) Continuation of application No. PCT/JP2020/017144, filed on Apr. 21, 2020.

(30) Foreign Application Priority Data

Apr. 26, 2019 (JP) ................................ 2019-086250

(51) Int. Cl.
*H01L 23/544* (2006.01)
*H01L 21/268* (2006.01)
(Continued)

(52) U.S. Cl.
CPC .......... *H01L 23/544* (2013.01); *H01L 21/268* (2013.01); *H01L 21/565* (2013.01); *H01L 23/552* (2013.01); *H01L 25/00* (2013.01)

(58) Field of Classification Search
None
See application file for complete search history.

(56) References Cited

U.S. PATENT DOCUMENTS

| 7,776,703 B2* | 8/2010 | Fukuchi ................ H01L 23/544 438/782 |
| 2014/0284775 A1 | 9/2014 | Nomura |
| 2022/0216164 A1* | 7/2022 | Komatsu ................. H01L 21/56 |

FOREIGN PATENT DOCUMENTS

| JP | 2003108003 A | 4/2003 |
| JP | 3468949 B2 | 11/2003 |

(Continued)

OTHER PUBLICATIONS

International Search Report issued for PCT/JP2020/017144, date of mailing Jun. 23, 2020.

(Continued)

*Primary Examiner* — Long Pham
(74) *Attorney, Agent, or Firm* — ArentFox Schiff LLP

(57) ABSTRACT

A module is provided that includes a substrate having a first main surface, a component mounted on the first main surface, a first sealing resin disposed so as to cover the first main surface and the component, and a shield film covering at least an upper surface of the first sealing resin. The shield film includes a protective layer exposed to the outside and a conductive layer covered by the protective layer. The color of a surface of the conductive layer closer to the protective layer is different from the color of the protective layer. Moreover, the laser absorption coefficient of a material of the protective layer is higher than the laser absorption coefficient of a material forming the surface of the conductive layer closer to the protective layer. The module includes a marking section that is not covered by the protective layer and from which the conductive layer is exposed.

20 Claims, 5 Drawing Sheets

(51) Int. Cl.
*H01L 21/56* (2006.01)
*H01L 23/552* (2006.01)
*H01L 25/00* (2006.01)

(56) References Cited

FOREIGN PATENT DOCUMENTS

| JP | 2008284584 A | 11/2008 |
|---|---|---|
| JP | 2010225752 A | 10/2010 |
| JP | 2011233648 A | 11/2011 |
| JP | 5500095 B2 | 5/2014 |
| JP | 5779227 B2 | 9/2015 |

OTHER PUBLICATIONS

Written Opinion of the International Searching Authority issued for PCT/JP2020/017144, date of mailing Jun. 23, 2020.

* cited by examiner

MODULE AND METHOD OF MANUFACTURING THE SAME

CROSS REFERENCE TO RELATED APPLICATIONS

The present application is a continuation of PCT/JP2020/017144 filed Apr. 21, 2020, which claims priority to Japanese Patent Application No. 2019-086250, filed Apr. 26, 2019, the entire contents of each of which are incorporated herein by reference.

TECHNICAL FIELD

The present invention relates to a module and a method of manufacturing the same.

BACKGROUND

Japanese Patent No. 5779227 (hereinafter "PTL 1") describes a method of manufacturing a semiconductor device. As described in PTL 1, a semiconductor element mounted on an upper surface of a wiring substrate is sealed with a mold resin, and a marking section is formed by printing the mold resin via laser irradiation. Then, a shield layer is formed on the entire surface of the mold resin on which the marking section is formed. According to PTL 1, a mark may be printed at a sufficient depth, which makes the marking section sufficiently visible.

Generally, a mold resin used for sealing a component in a module is a mixture of a resin ingredient and a filling material made of granular inorganic oxides (will referred to as a "filler" hereinafter). As the filler, silica is most commonly used. Generally, the mixing ratio of the filler is 70% to 95% by weight of the mold resin. Therefore, the filler occupies most part of the mold resin. Since silica has a high transmittance with respect to the wavelength of a laser beam used for the printing of a mark, the irradiated laser beam will not stop at the bottom surface of a recess to be formed as the marking section, but propagates through a plurality of fillers in the mold resin successively and penetrates deeply into the mold resin. As a result, the deeply penetrated laser beam may reach an electronic component disposed under the mold resin, and thereby, the electronic component may be damaged.

SUMMARY OF THE INVENTION

Therefore, it is an object of the present invention to provide a module in which a marking section is formed without damaging a component disposed inside the module. Moreover, a manufacturing method of providing the same is disclosed herein.

Accordingly, a module is provided according to the present invention that includes a substrate having a first main surface, a component mounted on the first main surface, a first sealing resin disposed so as to cover the first main surface and the component, and a shield film covering at least an upper surface of the first sealing resin. The shield film includes a protective layer exposed to the outside and a conductive layer covered by the protective layer. In this aspect, the color of a surface of the conductive layer closer to the protective layer is different from the color of the protective layer. The laser absorption coefficient of a material of the protective layer is higher than the laser absorption coefficient of a material forming a surface of the conductive layer closer to the protective layer. Moreover, the module further includes a marking section that is not covered by the protective layer and from which the conductive layer is exposed.

According to the exemplary aspect of the present invention, since the surface of the conductive layer closer to the protective layer and the protective layer have different colors, and the module includes a marking section from which the conductive layer is exposed, a user can visually recognize characters, patterns, marks and the like formed by the marking section. Since it is not necessary to deeply dig the marking section, the marking section can be formed without damaging a component disposed inside the module.

DETAILED DESCRIPTION OF EMBODIMENTS

Figure 1:
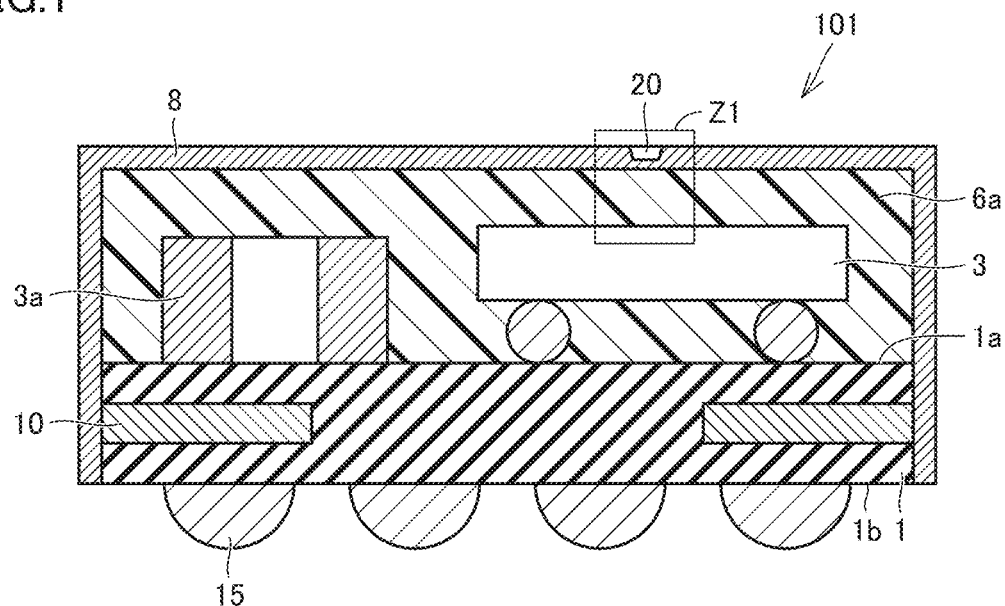
FIG. 1 is a cross-sectional view illustrating a module according to a first exemplary embodiment.

It is noted that components in the drawings may not be drawn to scale, and may be exaggerated for the convenience of explanation. In the following description, when an upper position or a lower position is mentioned, it does not necessarily mean an absolutely upper or lower position, and it may mean a relatively upper or lower position in the illustrated pose.

First Exemplary Embodiment

Figure 2:
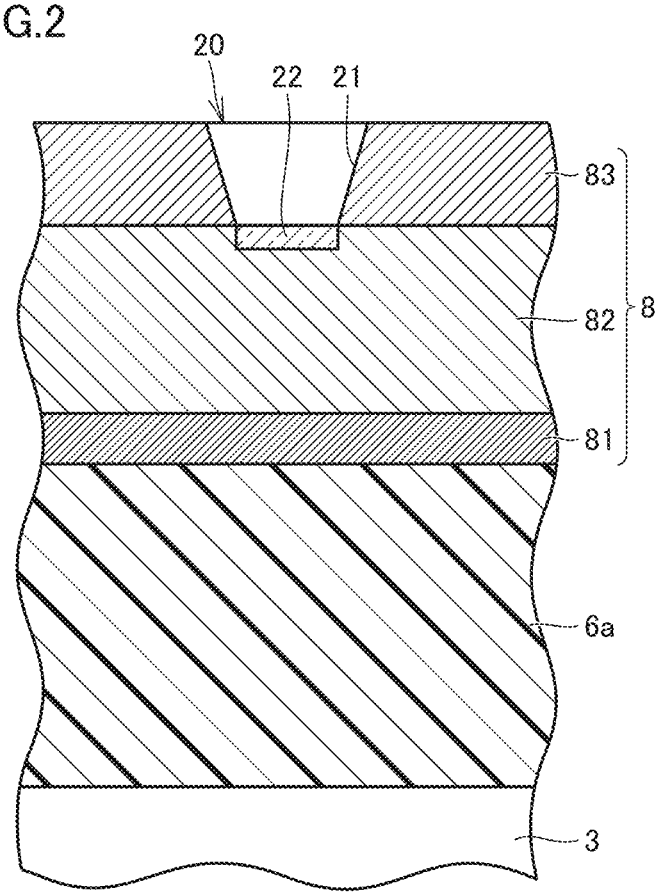
FIG. 2 is a partially enlarged cross-sectional view illustrating a portion Z1 in FIG. 1.

A module according to a first exemplary embodiment will be described with reference to FIGS. 1 to 2. FIG. 1 is a cross-sectional view illustrating a module 101 according to the present embodiment. FIG. 2 is an enlarged view illustrating a portion Z1 in FIG. 1.

As shown, the module 101 includes a substrate 1 having a first main surface 1a, components 3 and 3a mounted on the first main surface 1a, a first sealing resin 6a disposed so as to cover the first main surface 1a and the components 3 and 3a, and a shield film 8 covering at least an upper surface of the first sealing resin 6a. The module 101 further includes a GND electrode 10 formed inside the substrate 1. The GND electrode 10 is electrically connected to the shield film 8. The substrate 1 has a second main surface 1b opposite to the first main surface 1a. The module 101 further includes an external terminal 15 provided on the second main surface 1b.

As shown in FIG. 2, the shield film 8 includes a protective layer 83 exposed to the outside and a conductive layer 82 covered by the protective layer 83. The protective layer 83 may be formed of, for example, any metal of Ni, Cr and Ti, or an alloy containing any metal of Ni, Cr and Ti. The conductive layer 82 may be formed of, for example, Cu. The conductive layer 82 is preferably made of a metal having a color different from that of the other metal and high conductivity. From this viewpoint, Cu is preferable. Moreover, the protective layer 83 may be formed of stainless steel (SUS), for example. In an exemplary aspect, the thickness of the protective layer 83 may be about ⅒ of the thickness of the conductive layer 82. The thickness of the protective layer 83 may be several hundred nanometers (nm) to several micrometers (μm).

The color of a surface of the conductive layer 82 closer to the protective layer 83 is different from the color of the protective layer 83. In the present disclosure, the "color" of a material refers to a color exhibited in a visible light region. Moreover, the laser absorption coefficient of the material of the protective layer 83 is higher than the laser absorption coefficient of the material forming a surface of the conductive layer 82 closer to the protective layer 83. The module is formed with a marking section 20 that is not covered by the protective layer 83 and from which the conductive layer 82 is exposed.

As shown, a nitride film 22 is formed on the conductive layer 82 exposed from the marking section 20. Since the nitride film 22 is colorless and transparent, when a user views the marking section 20, the user may recognize the color of the main material of the conductive layer 82 through the nitride film 22. Although the nitride film 22 may not be electrically conductive, the nitride film 22 forms a part of the conductive layer 82. For purposes of this disclosure, the expression of "the color of a surface of the conductive layer 82 closer to the protective layer 83" refers to the color of the conductive layer 82 recognized through the nitride film 22 when the transparent nitride film 22 is formed on the outer surface of the conductive layer 82. In the present embodiment, the recess for forming the marking section 20 does not reach the first sealing resin 6a. In other words, no recess is formed on the first sealing resin 6a.

In addition to the protective layer 83 and the conductive layer 82, the shield film 8 further includes an adhesion layer 81. The shield film 8 has a structure in which at least three layers of the adhesion layer 81, the conductive layer 82, and the protective layer 83 are stacked in this order from the side closer to the first sealing resin 6a. In an additional aspect, the adhesion layer 81 can be formed of the same material as the protective layer 83.

In the present embodiment, since the shield film 8 has a structure including at least two layers of the protective layer 83 and the conductive layer 82, the surface of the conductive layer 82 closer to the protective layer 83 and the protective layer have different colors, and the module 101 includes the marking section 20 from which the conductive layer 82 is exposed, it is possible to use the marking section 20 to record necessary information. For example, since color of a portion where the surface of the conductive layer 82*i* is visible is different from the color of a portion where the protective layer 83 is visible, the user can visually recognize characters, patterns, marks and the like formed in the marking section 20. Since the marking section 20 may be visually recognized by the difference between the color of a portion where the surface of the conductive layer 82 is visible and the color of a portion where the protective layer 83 is visible, it is not necessary to deeply dig the marking section 20. In other words, it is only required to form the marking section 20 by digging the protective layer 83 to such an extent that the conductive layer 82 is visible.

Further, in an exemplary aspect, the marking section 20 can be formed by treating the shield film 8 only, and there is no need to remove the first sealing resin 6a located under the shield film 8. Since the first sealing resin 6a is not removed, the laser beam cannot pass through the filler in the sealing resin, and thereby, the laser beam cannot reach the components inside the module. Therefore, according to the present embodiment, a mark may be formed without damaging the components disposed inside the module.

Generally, an electronic component disposed inside a module includes a Si base, a circuit is formed on one surface of the Si base, and the electronic component is mounted in such a manner that the surface formed with the circuit faces the wiring substrate. Thus, the lower surface of the electronic component becomes the circuit surface, and the portion other than the lower surface becomes the thick Si base. However, since the wavelength of a laser beam used for the printing of a mark has high transmittance in Si, and if the laser beam reaches the electronic component disposed inside the module, the laser beam may easily pass through the Si base and damage the circuit disposed under the lower surface of the electronic component. However, according to the present embodiment, since the laser beam cannot reach the component disposed inside the module, damage to the circuit can be prevented.

In an exemplary aspect, the protective layer 83 is preferably a rustproof layer. The same applies to each embodiment in the following.

As illustrated in the present embodiment, the surface of the conductive layer 82 inside the marking section 20 is preferably covered with a nitride film 22. As such, it is possible to prevent the conductive layer 82 from being oxidized by covering the conductive layer 82 with the nitride film 22. For example, when the conductive layer 82 is formed of Cu, if the nitride film 22 is formed to cover Cu, the main material Cu is beneficially prevented from being oxidized.

As illustrated in the present embodiment, the shield film 8 preferably includes an adhesion layer 81 disposed on the conductive layer 82 closer to the first sealing resin 6a. Thus, it is easy to grow the conductive layer 82 in sufficiently strong and close contact with the first sealing resin 6a. In exemplary aspects, the material of the adhesion layer 81 may be the same as or different from the material of the conductive layer 82. The method of forming the adhesion layer 81 may be the same as or different from the method of forming the conductive layer 82. Generally, the method of forming the adhesion layer 81 is different from the method of forming the conductive layer 82. Generally, the adhesion layer 81 is thinner than the conductive layer 82.

Second Exemplary Embodiment

A method of manufacturing a module according to a second exemplary embodiment will be described with reference to FIG. 3.

The method of manufacturing a module according to the present embodiment includes a step S1 of preparing a module blank, and a step S2 of forming a marking section by irradiating an upper surface of the module blank with a laser beam in a nitrogen atmosphere. The module blank includes a substrate having a first main surface, a component mounted on the first main surface, a first sealing resin disposed so as to cover the first main surface and the component, and a shield film covering at least an upper surface of the first sealing resin. The shield film includes a protective layer exposed to the outside and a conductive layer covered by the protective layer. The color of a surface of the conductive layer closer to the protective layer is different from the color of the protective layer, and the laser absorption coefficient of a material of the protective layer is higher than the laser absorption coefficient of a material forming a surface of the conductive layer closer to the protective layer. A module is obtained after the marking section is formed on the module blank in step S2.

Figure 3:
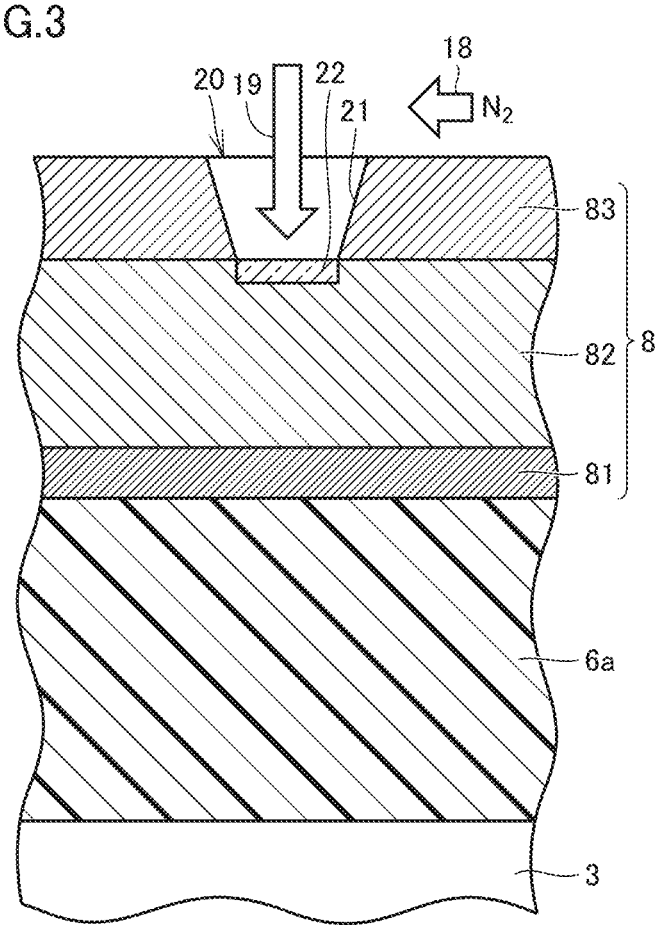
FIG. 3 is an explanatory view illustrating a laser irradiation step included in a method of manufacturing a module according to a second exemplary embodiment.

Step S2 is illustrated in FIG. 3. In step S2, laser beam 19 is irradiated in a nitrogen atmosphere as indicated by an arrow 18. Thereby, a through hole 21 is formed in the protective layer 83 to expose the conductive layer 82. Since the laser absorption coefficient of the conductive layer 82 is lower than that of the protective layer 83, when irradiated by the laser beam 19, the conductive layer 82 is less likely to be removed than the protective layer 83. The irradiation of the laser beam 19 may be terminated after the through hole 21 is formed in the protective layer 83. Since step S2 is performed in a nitrogen atmosphere, and in step S2, the surface of the conductive layer 82 is heated to a high temperature by the heat generated by the laser irradiation for removing the protective layer 83, a nitride film 22 is formed immediately on the exposed portion of the conductive layer 82.

If the conductive layer 82 is formed of Cu, the wavelength of the laser beam 19 for forming the marking section is preferably 532 nm or more at which Cu has a low laser absorption coefficient. The wavelength of the laser beam is more preferably 1064 nm or more.

According to the manufacturing method of the present embodiment, the module described in the first exemplary embodiment can be obtained. According to the present manufacturing method, it is easy to manufacture the module including a marking section 20 where a portion from which the conductive layer 82 is exposed is covered with the nitride film 22.

Third Exemplary Embodiment

Figure 4:
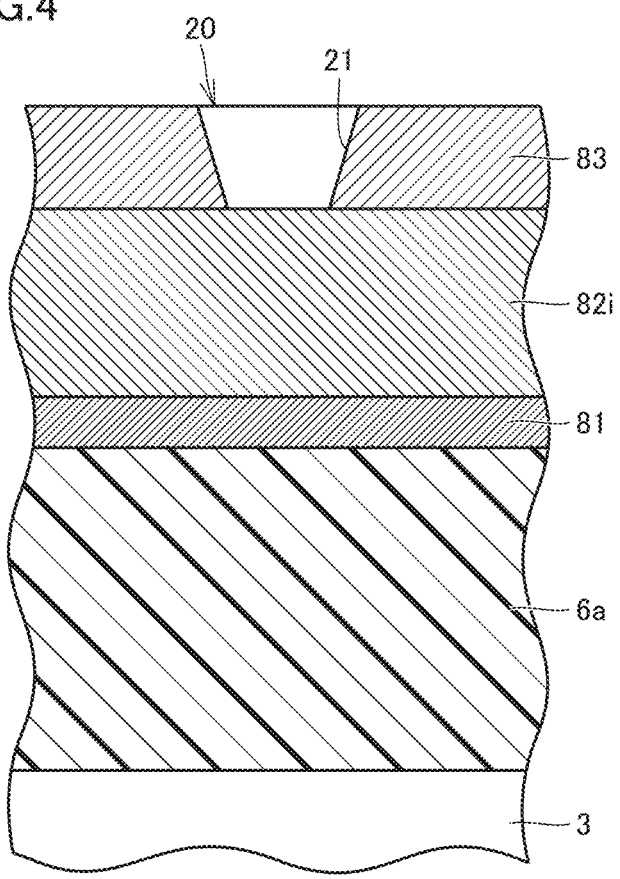
FIG. 4 is an enlarged cross-sectional view illustrating a portion of a module around a marking section according to a third exemplary embodiment.

A module according to a third exemplary embodiment will be described with reference to FIG. 4. FIG. 4 is an enlarged cross-sectional view illustrating a portion of a module around a marking section 20 according to the present embodiment. In the present embodiment, the shield film 8 includes a conductive layer 82i instead of the conductive layer 82 in the first embodiment. The color of a portion where the surface of the conductive layer 82i is visible is different from the color of a portion where the protective layer 83 is visible. Moreover, the conductive layer 82i is formed of a material which is hard to be oxidized. For example, the conductive layer 82i may be formed of Au. In the present embodiment, a nitride film 22 as that described in the first embodiment is not formed. Since the conductive layer 82i is formed of a material which is hard to be oxidized, there is no need to form a nitride film 22 to cover the exposed portion.

Also in the present embodiment, the effect described in the first embodiment may be obtained. In the present embodiment, since there is no need to form a nitride film in the marking section, it is easy to manufacture the module.

Fourth Exemplary Embodiment

Figure 5:
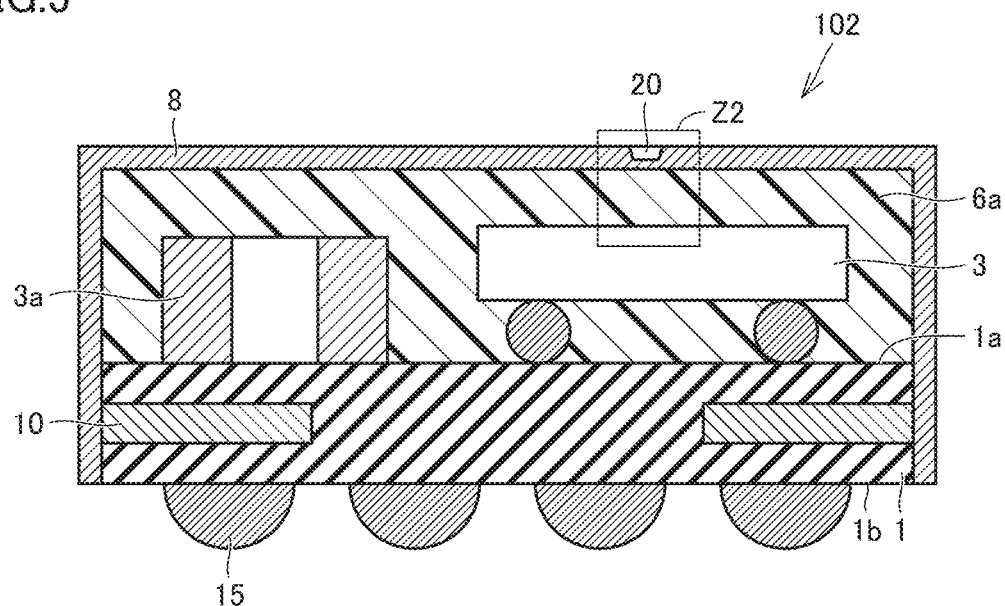
FIG. 5 is a cross-sectional view illustrating a module according to a fourth exemplary embodiment.
Figure 6:
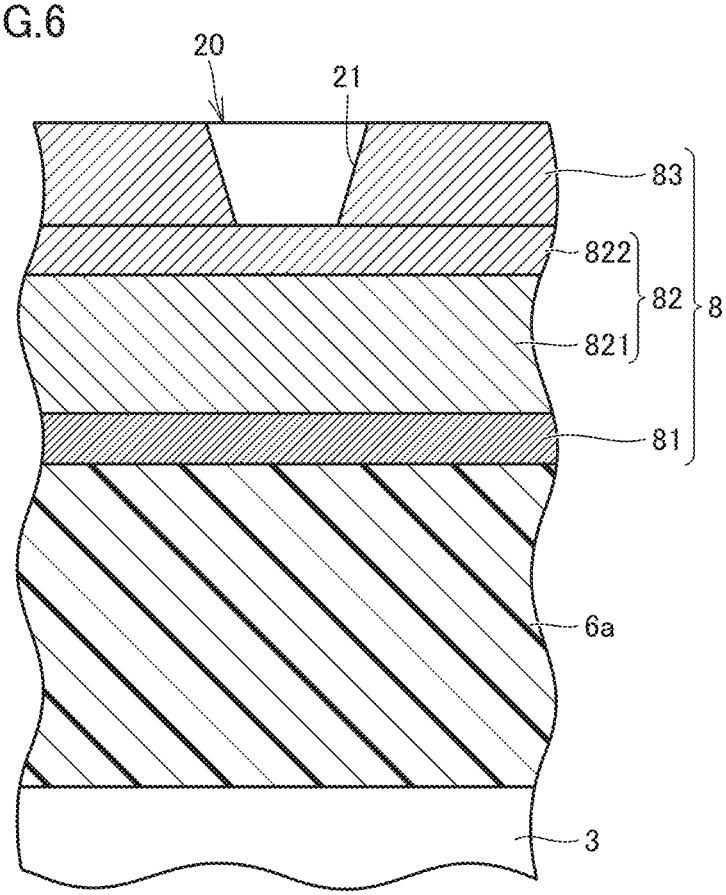
FIG. 6 is an enlarged cross-sectional view illustrating a portion Z2 in FIG. 5.

A module according to a fourth exemplary embodiment will be described with reference to FIGS. 5 to 6. FIG. 5 is a cross-sectional view illustrating a module 102 according to the present embodiment. FIG. 6 is an enlarged view illustrating a portion Z2 in FIG. 5.

The module 102 is substantially the same as the module 101 according to the first embodiment, but differs in the following points: the conductive layer 82 includes an upper conductive layer 822 forming a surface closer to the protective layer 83 and a lower conductive layer 821 disposed on one side of the upper conductive layer 822 opposite to the side where the protective layer 83 is located so as to overlap with the upper conductive layer 822, and the material of the upper conductive layer 822 is different from the material of the lower conductive layer 821.

From the viewpoint of forming a color different from that of the protective layer 83, the material of the upper conductive layer 822 is preferably Cu, a Cu alloy, or Au, for example. The Cu alloy is, for example, brass or bronze. Since the lower conductive layer 821 is not exposed even after the marking section is formed, the lower conductive layer 821 can be made of a material having high conductivity and the same color as the protective layer 83. For example, the material of the lower conductive layer 821 is preferably Al, Ag, or the like, in various exemplary aspects.

Also in the present embodiment, the same effect as that described in the first embodiment may be obtained. Since the conductive layer 82 is formed to have a two-layer structure including the upper conductive layer 822 and the lower conductive layer 821 having different materials, the upper conductive layer 822 may be formed of a material which is hard to be oxidized, and the lower conductive layer 821 may be formed of a material which is easy to be oxidized. For example, the upper conductive layer 822 may be formed of Au, and the lower conductive layer 821 may be formed of Cu. In this way, the conductive layer 82 can be provided with a required thickness as a whole while suppressing the thickness of the upper conductive layer formed of expensive Au. Since the lower conductive layer 821 is covered with the upper conductive layer 822, it is possible to prevent the lower conductive layer 821 from being oxidized.

Figure 7:
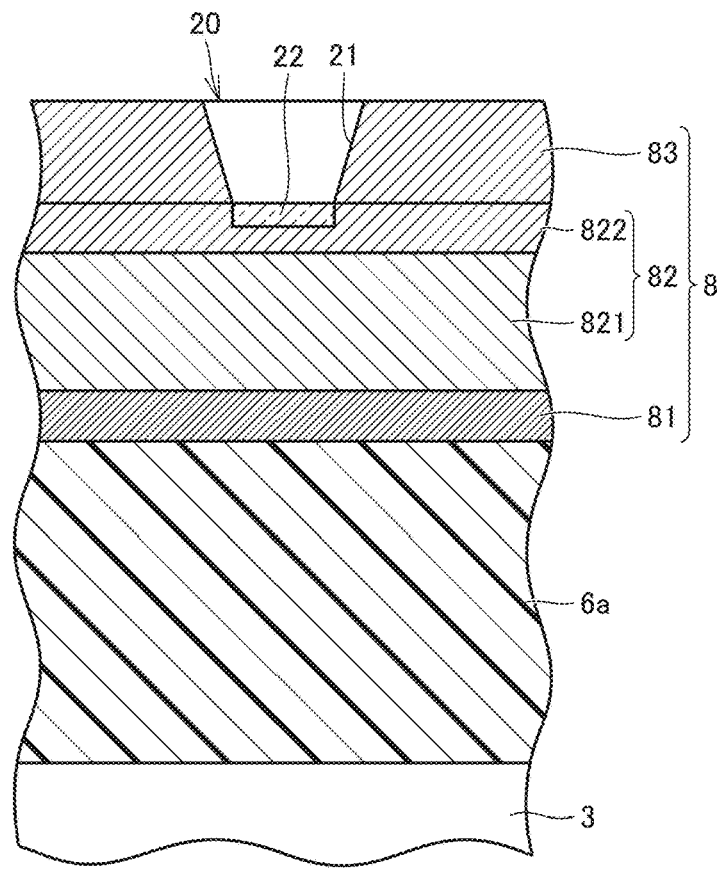
FIG. 7 is a partially enlarged cross-sectional view illustrating a modification of the module according to the fourth exemplary embodiment.

Although as illustrated in FIG. 6, a nitride film 22 is not formed on the upper conductive layer 822, a nitride film 22 may be formed on the upper conductive layer 822 as illustrated in FIG. 7. If necessary, the conductive layer 82 can be formed of a combination of two different materials. If a nitride film 22 is formed on the upper conductive layer 822, the upper conductive layer 822 is prevented from being oxidized, and since the lower conductive layer 821 is covered by the upper conductive layer 822, the lower conductive layer 821 is also prevented from being oxidized.

Fifth Exemplary Embodiment

Figure 8:
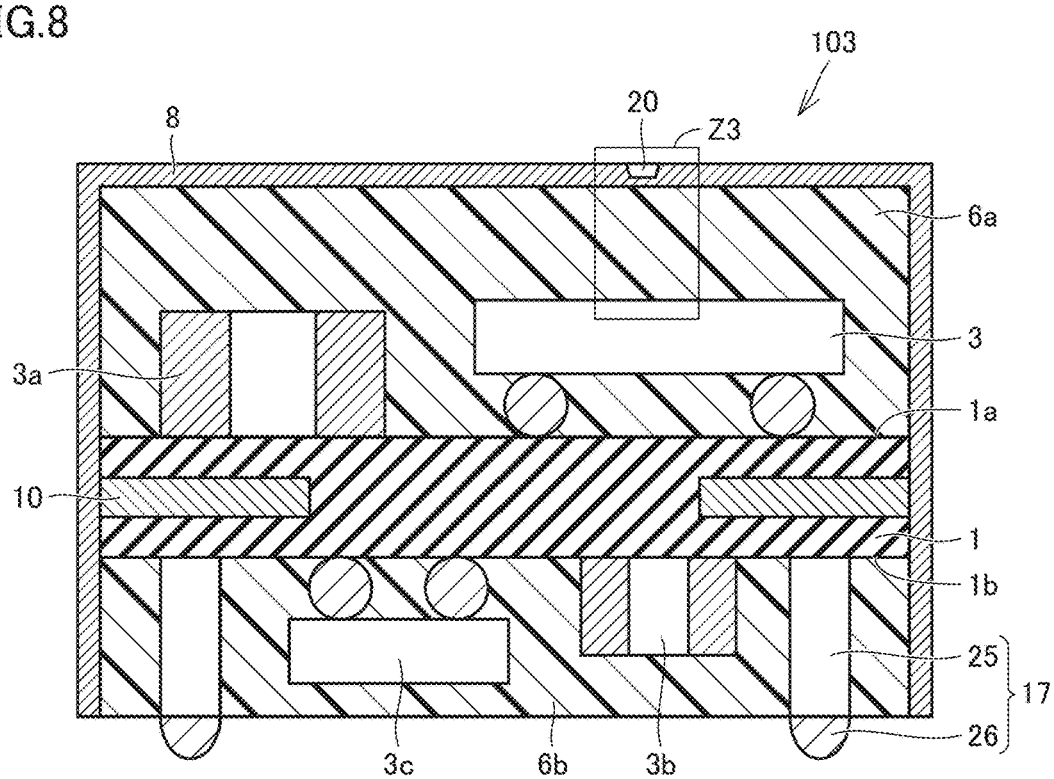
FIG. 8 is a cross-sectional view illustrating a module according to a fifth exemplary embodiment.

A module according to a fifth exemplary embodiment will be described with reference to FIG. 8. FIG. 8 is a cross-sectional view illustrating a module 103 according to the present embodiment. The module 103 is a double-side mounted module. The module 103 includes a substrate 1 having a first main surface 1a and a second main surface 1b. A component 3 and a component 3a are mounted on the first main surface 1a of the substrate 1. A component 3b and a component 3c are mounted on the second main surface 1b of the substrate 1. A first sealing resin 6a is disposed on the first main surface 1a of the substrate 1. A second sealing resin 6b is disposed on the second main surface 1b of the substrate 1. The components 3 and 3a are covered by the first sealing resin 6a. The components 3b and 3c are covered by the second sealing resin 6b. In the module 103, the shield film 8 covers the upper surface and the side surface of the first sealing resin 6a, the side surface of the substrate 1, and the side surface of the second sealing resin 6b.

The module 103 includes an external terminals 17. The external terminal 17 includes a columnar conductor 25 and a solder bump 26. The columnar conductor 25 is disposed so as to penetrate the second sealing resin 6b. The solder bump 26 is provided on the lower surface of the module 103. The solder bumps 26 is electrically connected to the substrate 1 by the columnar conductor 25. An enlarged view of a portion Z3 in FIG. 8 is the same as that illustrated in FIG. 2.

Also in the present embodiment, the same effect as that described in the first embodiment may be obtained. The conductive layer 82 having a two-layer structure as described in the fourth embodiment may be applied to a double-sided mounting module such as the module 103.

In general, in the exemplary embodiments mentioned above, it is described that the marking section is formed on the upper surface of the module, but it is not limited thereto, and the marking section may be formed on any other surface. The shield film 8 may cover any surface of the module other than the upper surface. The marking section may be formed on any surface as long as it is covered by the shield film 8. The marking section may be formed on any surface other than the upper surface, for example, it may be formed on a side surface.

REFERENCE SIGNS LIST

1: substrate; 1a: first main surface; 1b: second main surface; 3, 3a, 3b, 3c: component; 6a: first sealing resin; 6b: second sealing resin; 8: shield film; 10: GND electrode; 15, 17: external terminal; 18: arrow; 19: laser beam; 20: marking section; 21: through hole; 22: nitride film; 25: columnar conductor; 26: solder bump; 81: adhesion layer; 82, 82i: conductive layer; 83: protective layer; 101, 102, 103: module; 821: lower conductive layer; 822: upper conductive layer

The invention claimed is:

1. A module comprising:
a substrate having a first main surface;
a component mounted on the first main surface;
a first sealing resin covering the first main surface and the component; and
a shield film covering at least a surface of the first sealing resin that is opposite the first main surface of the substrate, with the shield film including a protective layer exposed to an outside of the module and a conductive layer covered by the protective layer,
wherein a material of the protective layer has a laser absorption coefficient that is higher than a laser absorption coefficient of a material of the surface of the conductive layer,
wherein the module further comprises a marking section that is not covered by the protective layer and from which the conductive layer is visually exposed to the outside of the module,
wherein a transparent layer is disposed in the marking section on a surface of the conductive layer that is visually exposed to the outside of the module, and
wherein at least a portion of the conductive layer that is visually exposed to the outside of the module through the transparent layer comprises a color that is different from a color of the protective layer.

2. The module according to claim 1, wherein the surface of the conductive layer closer to the protective layer is directly coupled to the protective layer.

3. The module according to claim 1, wherein the conductive layer includes an upper conductive layer that forms the surface closer to the protective layer and a lower conductive layer disposed on a side of the upper conductive layer opposite to a side where the protective layer is disposed so as to overlap with the upper conductive layer.

4. The module according to claim 3, wherein the upper conductive layer comprises a material that is different from a material of the lower conductive layer.

5. The module according to claim 4, wherein the material of the lower conductive layer comprises a same material as the material of the protective layer.

6. The module according to claim 4, wherein the material of the lower conductive layer comprises is a material that is easier to oxidize than the material of the upper conductive layer.

7. The module according to claim 1, wherein the protective layer comprises a rustproof layer.

8. The module according to claim 1, wherein the transparent layer comprises a nitride film that covers the surface of the conductive layer in the marking section.

9. The module according to claim 1, wherein the shield film includes an adhesion layer disposed on the conductive layer closer to the first sealing resin.

10. The module according to claim 1, wherein the substrate includes a second main surface opposite to the first main surface, and an additional component is mounted on the second main surface of the substrate.

11. The module according to claim 10, further comprising a second sealing resin covering the second main surface and the additional component.

12. The module according to claim 11, wherein the marking section comprises a recess that extends through the protective layer to visually expose the surface of the conductive layer to the outside of the module.

13. A module comprising:
a substrate;
a component mounted on a surface of the substrate;
a first sealing resin that covers the substrate and the component;
a shield film that covers the first sealing resin and that includes a conductive layer and a protective layer; and
a marking section that is not covered by the protective layer and from which the conductive layer is visually exposed to an outside of the module,
wherein a transparent layer is disposed in the marking section on a surface of the conductive layer that is visually exposed to the outside of the module, and
wherein at least a portion of the conductive layer that is visually exposed to the outside of the module through the transparent layer comprises a color that is different from a color of the protective layer.

14. The module according to claim 13, wherein the marking section comprises a recess that extends through the protective layer to visually expose the conductive layer to the outside of the module.

15. A method of manufacturing a module, the method comprising:
preparing a module blank that includes:
a substrate having a first main surface,
a component mounted on the first main surface,
a first sealing resin covering the first main surface and the component, and
a shield film covering at least a surface of the first sealing resin that is opposite the first main surface of the substrate, with the shield film including a protective layer and a conductive layer covered by the protective layer; and forming a marking section by irradiating an upper surface of the module blank with a laser beam in a nitrogen atmosphere to form a recess that visually exposes a surface of the conductive layer to an outside of the module, wherein a material of the protective layer has a laser absorption coefficient that is higher than a laser absorption coefficient of a material forming the conductive layer, wherein a transparent layer is formed in the marking section on the surface of the conductive layer that is visually exposed to the outside of the module, and wherein at least a portion of the conductive layer that is visually exposed to the outside of the module through the transparent layer comprises a color that is different from a color of the protective layer.

16. The method according to claim 15, further comprising forming the conductive layer to include an upper conductive layer that forms the surface closer to the protective layer and a lower conductive layer disposed on a side of the upper conductive layer opposite to a side where the protective layer is disposed so as to overlap with the upper conductive layer.

17. The method according to claim 16, further comprising forming the upper conductive layer from a material that is different from a material that forms the lower conductive layer.

18. The method according to claim 15, wherein the transparent layer comprises a nitride film to cover the surface of the conductive layer in the marking section.

19. The method according to claim 15, further comprising mounting an additional component on a second main surface of the substrate that is opposite to the first main surface.

20. The method according to claim 19, further comprising forming a second sealing resin to cover the second main surface and the additional component.

* * * * *